United States Patent
Ye et al.

(10) Patent No.: US 10,204,788 B1
(45) Date of Patent: Feb. 12, 2019

(54) METHOD OF FORMING HIGH DIELECTRIC CONSTANT DIELECTRIC LAYER BY ATOMIC LAYER DEPOSITION

(71) Applicant: UNITED MICROELECTRONICS CORP., Hsin-Chu (TW)

(72) Inventors: Shan Ye, Kaohsiung (TW); Shih-Cheng Chen, Tainan (TW); Tsuo-Wen Lu, Kaohsiung (TW); Tzu-Hsiang Su, Tainan (TW); Po-Jen Chuang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/859,721

(22) Filed: Jan. 1, 2018

(51) Int. Cl.
  *H01L 21/28* (2006.01)
  *H01L 21/02* (2006.01)
  *C23C 16/455* (2006.01)
  *H01L 29/51* (2006.01)

(52) U.S. Cl.
  CPC .. *H01L 21/28194* (2013.01); *C23C 16/45527* (2013.01); *C23C 16/45553* (2013.01); *H01L 21/0228* (2013.01); *H01L 21/02178* (2013.01); *H01L 21/02181* (2013.01); *H01L 21/02183* (2013.01); *H01L 29/517* (2013.01)

(58) Field of Classification Search
  None
  See application file for complete search history.

(56) References Cited

U.S. PATENT DOCUMENTS

| | | | |
|---|---|---|---|
| 7,067,439 B2 | 6/2006 | Metzner | |
| 7,396,719 B2 | 7/2008 | Kim | |
| 7,727,911 B2 * | 6/2010 | Yoneda | H01L 21/02156 438/591 |
| 8,288,811 B2 * | 10/2012 | Ramaswamy | H01L 21/0228 438/287 |
| 2004/0198069 A1 | 10/2004 | Metzner | |
| 2005/0239297 A1 | 10/2005 | Senzaki | |

* cited by examiner

*Primary Examiner* — Chandra Chaudhari
(74) *Attorney, Agent, or Firm* — Winston Hsu

(57) ABSTRACT

A method of forming a high dielectric constant (high-k) dielectric layer by atomic layer deposition includes the following steps. Cycles are performed one after another, and each of the cycles sequentially includes performing a first oxygen precursor pulse to supply an oxygen precursor to a substrate disposed in a reactor; performing a first oxygen precursor purge after the first oxygen precursor pulse; performing a chemical precursor pulse to supply a chemical precursor to the substrate after the first oxygen precursor purge; and performing a chemical precursor purge after the chemical precursor pulse. The first oxygen precursor pulse, the first oxygen precursor purge, the chemical precursor pulse, and the chemical precursor purge are repeated by at least 3 cycles. A second oxygen precursor pulse is performed to supply an oxygen precursor to the substrate after the cycles. A second oxygen precursor purge is performed after the second oxygen precursor pulse.

15 Claims, 4 Drawing Sheets

METHOD OF FORMING HIGH DIELECTRIC CONSTANT DIELECTRIC LAYER BY ATOMIC LAYER DEPOSITION

BACKGROUND OF THE INVENTION

1. Field of the Invention

The present invention relates to a method of forming a high dielectric constant (high-k) dielectric layer, and more particularly, to a method of forming a high dielectric constant dielectric layer by atomic layer deposition (ALD).

2. Description of the Prior Art

In the continuously improved semiconductor integrated circuit technology, the sizes of the semiconductor devices become smaller for increasing the integrity of the integrated circuit. In the scaling down process, the thickness control of layers in the semiconductor device becomes more and more critical. As the thickness of the gate dielectric layer in the metal-oxide-semiconductor field effect transistor (MOSFET) decreases, leakage currents due to tunneling increase, leading to high power consumption and reduced device reliability. For improving the metal-oxide-semiconductor field effect transistor device performance as feature sizes continue to decrease, the traditional gate oxide and polysilicon gate electrode are replaced by a high dielectric constant (high-k) gate dielectric and a metal gate electrode. The high dielectric constant gate dielectric may be used to increase gate capacitance without the associated leakage effects. Defect states in the high dielectric constant gate dielectric can influence its electrical properties. Therefore, the material quality of the high dielectric constant gate dielectric is an important part for improving the performance and the reliability of the metal-oxide-semiconductor field effect transistor device

SUMMARY OF THE INVENTION

A method of forming a high dielectric constant (high-k) dielectric layer by atomic layer deposition is provided in the present invention. A first oxygen precursor pulse, a first oxygen precursor purge, a chemical precursor pulse, and a chemical precursor purge are sequentially performed and are repeated by at least 3 cycles before a second oxygen precursor pulse and a second oxygen precursor purge for reducing impurities in the high dielectric constant dielectric layer.

A method of forming a high dielectric constant dielectric layer by atomic layer deposition includes the following steps. A plurality of cycles are performed one after another, and each of the cycles sequentially includes (a) performing a first oxygen precursor pulse to supply an oxygen precursor to a substrate disposed in a reactor; (b) subsequent to step (a), performing a first oxygen precursor purge; (c) subsequent to step (b), performing a chemical precursor pulse to supply a chemical precursor to the substrate; and (d) subsequent to step (c), performing a chemical precursor purge. Steps (a) to (d) are repeated by at least 3 cycles. A second oxygen precursor pulse is performed to supply an oxygen precursor to the substrate after the cycles. A second oxygen precursor purge is performed after the second oxygen precursor pulse.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a method of forming a high dielectric constant dielectric layer by atomic layer deposition according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
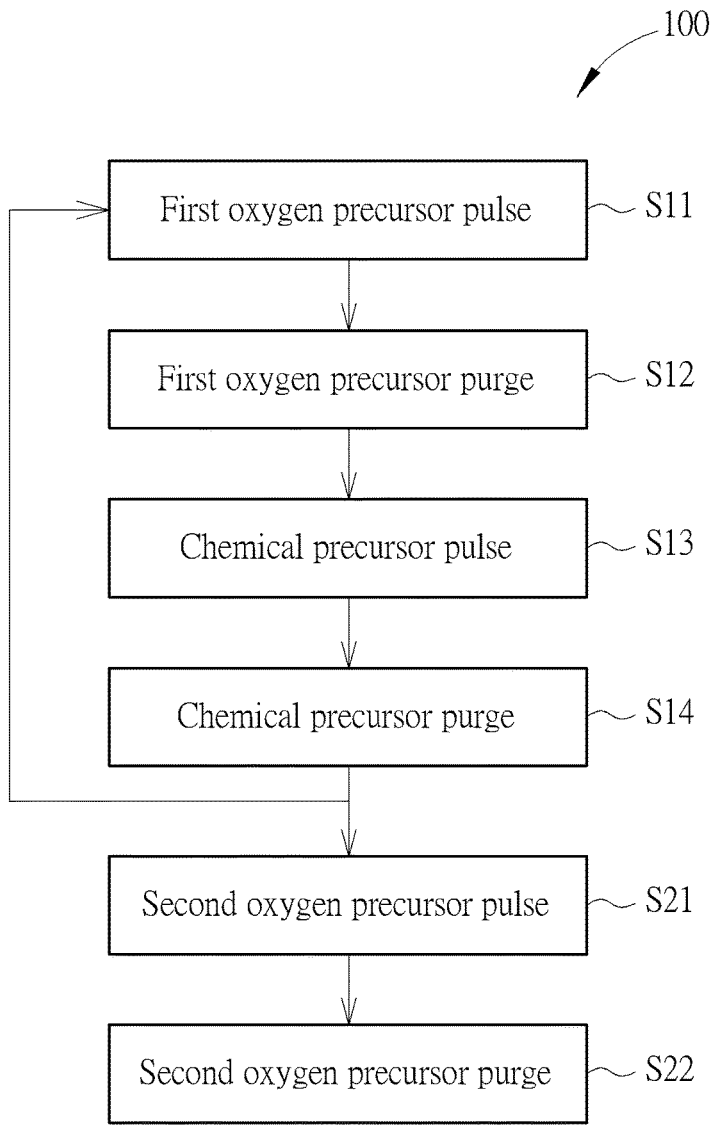
FIG. 1 is a flowchart of a method of forming a high dielectric constant dielectric layer by atomic layer deposition according to an embodiment of the present invention.
Figure 2:
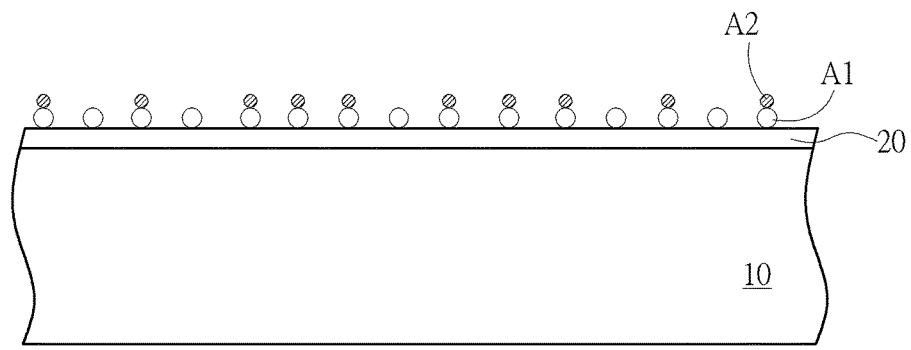

Please refer to FIGS. 1-8. FIG. 1 is a flow chart of a method of forming a high dielectric constant (high-k) dielectric layer by atomic layer deposition (ALD) according to an embodiment of the present invention. FIGS. 2-8 are schematic drawings illustrating the method of forming the high dielectric constant dielectric layer by atomic layer deposition in this embodiment. The method of forming the high dielectric constant dielectric layer by atomic layer deposition in this embodiment may include the following steps. As shown in FIG. 1 and FIG. 2, a plurality of cycles 100 are performed one after another, and each of the cycles 100 sequentially includes step S11, step S12, step S13, and step S14. In step S11, a first oxygen precursor pulse is performed to supply an oxygen precursor to a substrate 10 disposed in a reactor (not shown). In some embodiments, the reactor may be a process chamber of an ALD apparatus or other portion of the ALD apparatus, but not limited thereto. In some embodiments, the substrate 10 may include a semiconductor substrate or a non-semiconductor substrate. The semiconductor substrate mentioned above may include a silicon substrate, an epitaxial silicon substrate, a silicon germanium substrate, a silicon carbide substrate, or a silicon-on-insulator (SOI) substrate, but not limited thereto. In some embodiments, the oxygen precursor of the first oxygen precursor pulse may include hydrogen dioxide ($H_2O$), oxygen ($O_2$), ozone ($O_3$), hydrogen peroxide ($H_2O_2$), and/or other suitable oxidizer. The oxygen precursor is introduced into the reactor and pulsed for a period of time for forming a monolayer of oxygen atoms on the substrate 10. The period of time mentioned above may be regarded as a pulse duration of the first oxygen precursor pulse. As shown in FIG. 2, the oxygen precursor may include a first atom A1 and a second atom A2. When the oxygen precursor is hydrogen dioxide, the first atom A1 may be an oxygen atom, and the second atom A2 may be a hydrogen atom. The oxygen atoms may be deposited on the substrate 10 for forming a monolayer of oxygen atoms. In some embodiments, an interfacial layer 20 may be formed on the substrate 10 before the atomic layer deposition, and the monolayer of oxygen atoms may be formed on the interfacial layer, but not limited thereto. The interfacial layer 20 may include silicon oxide or other suitable oxide dielectric materials.

After step S11, step S12 is carried out to perform a first oxygen precursor purge after the first oxygen precursor pulse. In the first oxygen precursor purge, the reactor is purged to remove the oxygen precursor and/or impurities by a purging gas. In some embodiments, the purging gas mentioned above may include an inert gas, such as argon (Ar), helium (He), or neon (Ne), but not limited thereto. The purging gas purges the reactor for a period of time after the first oxygen precursor pulse for removing the oxygen precursor, and the period of time mentioned above may be regarded as a purge duration of the first oxygen precursor purge.

Figure 3:
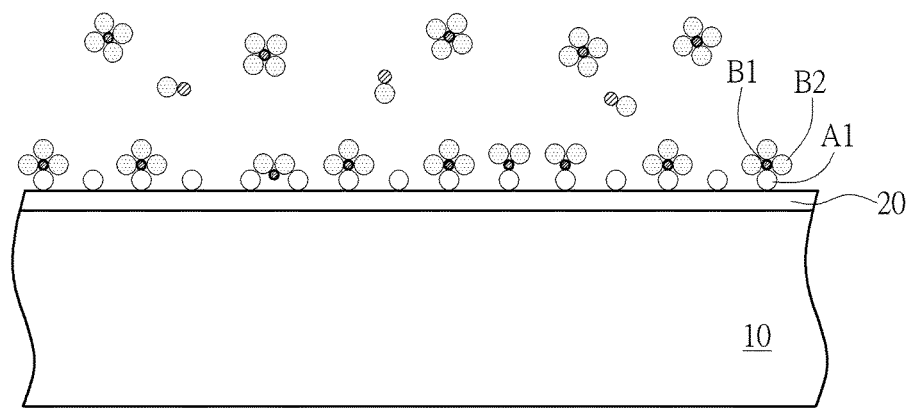

As shown in FIG. 1 and FIG. 3, after step S12, step S13 is carried out to perform a chemical precursor pulse. In the chemical precursor pulse a chemical precursor is supplied to the substrate 10 after the first oxygen precursor purge. In some embodiments, the chemical precursor may include a hafnium (Hf) precursor for forming a hafnium oxide layer, a tantalum (Ta) precursor for forming a tantalum oxide layer, an aluminum (Al) precursor for forming an aluminum oxide layer, or other kinds of precursors for forming a specific high-k dielectric layer. In other words, the chemical precursor may include a precursor of an element included in the high-k dielectric layer going to be formed on the substrate 10. The chemical precursor is introduced into the reactor and pulsed for a period of time for reacting with the monolayer of oxygen atoms on the substrate 10. For example, the Hf precursor mentioned above may include hafnium chloride ($HfCl_4$), tetrakis-ethyl methylaminohafnium (TEMAHf), hafnium dialkyl amides, hafnium alkoxides, hafnium dieketonates, or other suitable kinds of precursors containing Hf. As shown in FIG. 3, the chemical precursor may include a third atom B1 and a fourth atom B2. When the chemical precursor is hafnium chloride, the third atom B1 may be a hafnium atom, and the fourth atom B2 may be a chlorine atom. Some of the third atoms may be connected with the first atoms A1 for forming a monolayer of hafnium atoms.

Figure 4:
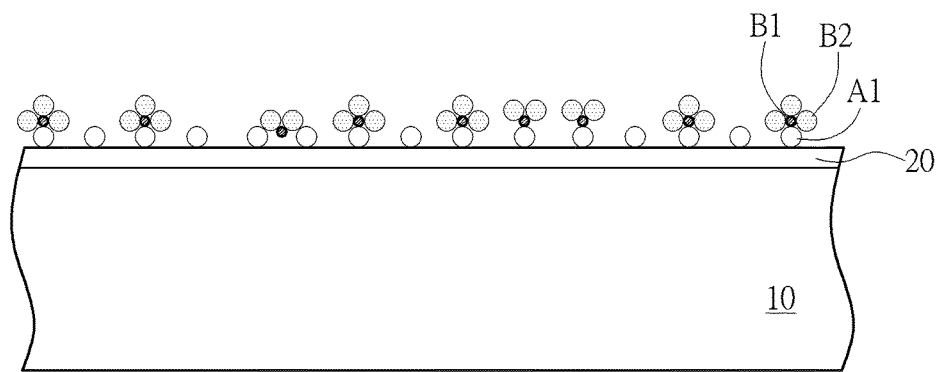

As shown in FIG. 1, FIG. 3, and FIG. 4, after step S13, step S14 is carried out to perform a chemical precursor purge after the chemical precursor pulse. In the chemical precursor purge, the reactor is purged to remove the chemical precursor and/or impurities by a purging gas. In some embodiments, the purging gas mentioned above may be an inert gas, such as Ar, He, or Ne, but not limited thereto. The purging gas purges the reactor for a period of time after the chemical precursor pulse for removing the chemical precursor and/or impurities, such as chlorine, hydrogen chloride, carbon, and/or hydrogenated carbon ($CH_x$), but not limited thereto.

Figure 5:
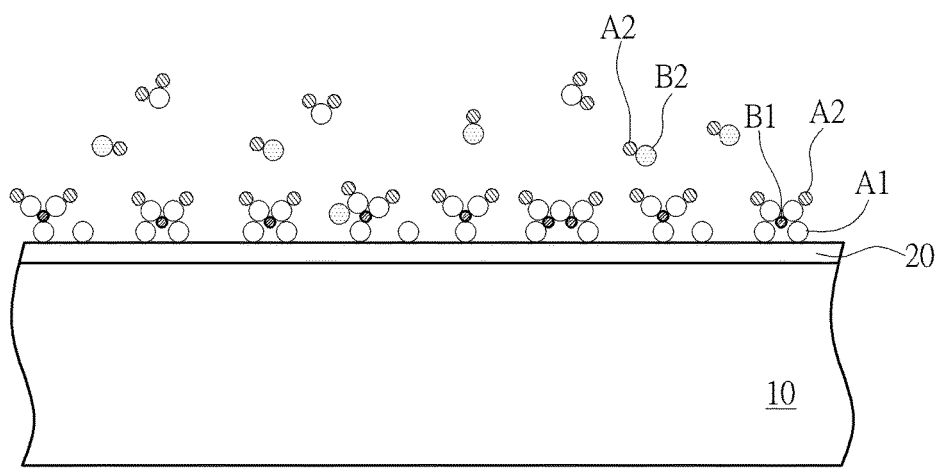
Figure 6:
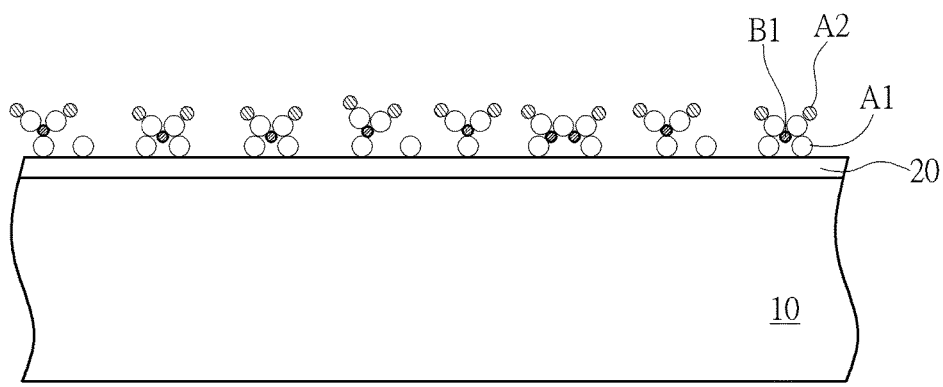

As shown in FIG. 1, FIG. 5, and FIG. 6, the first oxygen precursor pulse, the first oxygen precursor purge, the chemical precursor pulse, and the chemical precursor purge may be repeated by at least 3 cycles 100 for forming the monolayers of oxygen atoms and the monolayers of the specific element included in the chemical precursor. The number of the cycles 100 to be performed may be determined by the required thickness of the high-k dielectric layer. In other words, the thickness of the high-k dielectric layer increases as the number of the cycles 100 increases. In addition, the first oxygen precursor pulse is the first step of the atomic layer deposition, and there is not any chemical precursor pulse before the cycles 100 in the atomic layer deposition of this embodiment. The first oxygen precursor pulse is performed before the chemical precursor pulse for preventing impurities, such as chlorine, hydrogen chloride, carbon, and/or hydrogenated carbon, from being trapped at the bottom of the high-k dielectric layer. In other words, the impurities in the high-k dielectric layer may be reduced by performing the first oxygen precursor pulse first in the atomic layer deposition.

Figure 7:
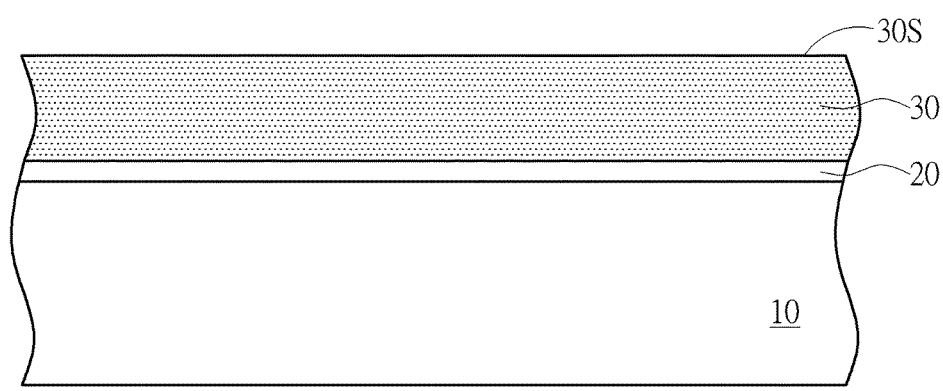

As shown in FIG. 1 and FIG. 7, after the cycles 100, step S21 is carried out. In step S21, a second oxygen precursor pulse is performed to supply an oxygen precursor to the substrate 10 after the cycles 100. The oxygen precursor of the second oxygen precursor pulse may include $H_2O$, oxygen $O_2$, ozone $O_3$, $H_2O_2$, and/or other suitable oxidizer. The oxygen precursor of the second oxygen precursor pulse and the oxygen precursor of the first oxygen precursor pulse may be identical or different from one another. The oxygen precursor is introduced into the reactor and pulsed for a period of time for forming a monolayer of oxygen atoms. The period of time mentioned above may be regarded as a pulse duration of the second oxygen precursor pulse. A high-k dielectric layer 30 may be formed by performing the cycles 100 and the second oxygen precursor pulse mentioned above. In other words, the second oxygen precursor pulse may be the last pulse step in the atomic layer deposition, and the second oxygen precursor pulse may be regarded as an in-situ oxidation step after the cycles 100, but not limited thereto. In some embodiments, the second oxygen precursor pulse may be different from the first oxygen precursor pulse in each of the cycles 100 described above. Specifically, in the second oxygen precursor pulse, impurities, such as chlorine atoms, may be replaced by the oxygen atoms on the surface of the high-k dielectric layer 30. Therefore, in some embodiments, the pulse duration of the second oxygen precursor pulse may be longer than the pulse duration of the first oxygen precursor pulse in each of the cycles 100 for ensuring the performance of removing the impurities by the second oxygen precursor pulse. For example, the pulse duration of the second oxygen precursor pulse is 3 to 10 times longer than the pulse duration of the first oxygen precursor pulse in each of the cycles 100, but not limited thereto. Additionally, other process conditions of the second oxygen precursor pulse may also be modified for enhancing the effect of removing the impurities. For example, in some embodiments, an oxygen precursor concentration of the second oxygen precursor pulse may be higher than an oxygen precursor concentration of the first oxygen precursor pulse in each of the cycles 100 for enhancing the effect of removing the impurities, but not limited thereto.

Subsequently, step S22 is carried out after step S21. In step S22, a second oxygen precursor purge is performed after the second oxygen precursor pulse. In the second oxygen precursor purge, the reactor is purged to remove the oxygen precursor and the impurities by a purging gas. In some embodiments, the purging gas mentioned above may include an inert gas, such as Ar, He, or Ne, but not limited thereto. The purging gas purges the reactor for a period of time after the second oxygen precursor pulse for removing the oxygen precursor and the impurities, and the period of time mentioned above may be regarded as a purge duration of the second oxygen precursor purge. Impurities, such as chlorine, hydrogen chloride, carbon, and/or hydrogenated carbon, on the top surface 30S of the high-k dielectric layer 30 may be removed by the second oxygen precursor purge. Therefore, in some embodiments, the process conditions of the second oxygen precursor purge may be different from the process conditions of the first oxygen precursor purge in each of the cycles 100. For example, in some embodiments, the purge duration of the second oxygen precursor purge may be longer than the purge duration of the first oxygen precursor purge in each of the cycles 100 for ensuring the performance of removing the impurities. In some embodiments, a flow rate of the purging gas introduced into the reactor in the second oxygen precursor purge may be higher than a flow rate of the purging gas introduced into the reactor in the first oxygen precursor purge described above for enhancing the effect of removing the impurities, but not limited thereto. Accordingly, the second oxygen precursor purge may be the last step of the atomic layer deposition. By performing the first oxygen precursor pulse before the chemical precursor pulse, performing the second oxygen precursor pulse different from the first oxygen precursor pulse in each of the cycles 100, and/or performing the second oxygen precursor purge different from the first oxygen precursor purge in each of the cycles 100, the impurities in the high-k dielectric layer 30 may be reduced without substantially increasing the total process time of the ALD process, and the material quality of the high-k dielectric layer 30 may be enhanced accordingly.

Compared with a high-k dielectric layer formed by an ALD process without the second oxygen precursor pulse and the second oxygen precursor purge of the present invention, the concentration of oxygen atoms in the high-k dielectric layer 30 may be enhanced because of the reduction of the impurities. For example, when the high-k dielectric layer 30 is a hafnium oxide layer, the ratio of the oxygen atoms to the hafnium atoms in the high-k dielectric layer 30 may become closer to 2 relatively. Additionally, the high-k dielectric layer 30 may be relatively thinner because the impurities on the top surface of the high-k dielectric layer 30 may be removed by the second oxygen precursor pulse and/or the second oxygen precursor purge of the present invention, but not limited thereto. Accordingly, the leakage current of a field effect transistor including the high-k dielectric layer 30 may be reduced by the method of forming the high-k dielectric layer 30 in the present invention.

To summarize the above descriptions, in the method of forming the high-k dielectric layer by atomic layer deposition according to the present invention, the first oxygen precursor pulse, the first oxygen precursor purge, the chemical precursor pulse, and the chemical precursor purge are sequentially performed and are repeated by at least 3 cycles before the second oxygen precursor pulse and the second oxygen precursor purge for reducing the impurities in the high dielectric constant dielectric layer. Additionally, the second oxygen precursor pulse may be different from the first oxygen precursor pulse in each of the cycles and/or the second oxygen precursor purge may be different from the first oxygen precursor purge in each of the cycles for further reducing the impurities in the high-k dielectric layer without substantially increasing the total process time of the ALD process. The material quality of the high-k dielectric layer may be enhanced by the method of the present invention, and the electrical properties of the field effect transistor including the high-k dielectric layer may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a high dielectric constant (high-k) dielectric layer by atomic layer deposition, comprising:
   performing a plurality of cycles one after another, each of the cycles sequentially comprising:

(a) performing a first oxygen precursor pulse to supply an oxygen precursor to a substrate disposed in a reactor;
   (b) subsequent to step (a), performing a first oxygen precursor purge;
   (c) subsequent to step (b), performing a chemical precursor pulse to supply a chemical precursor to the substrate; and
   (d) subsequent to step (c), performing a chemical precursor purge, wherein steps (a) to (d) are repeated by at least 3 cycles; and
   performing a second oxygen precursor pulse to supply an oxygen precursor to the substrate after the cycles; and
   performing a second oxygen precursor purge after the second oxygen precursor pulse.

2. The method of forming the high-k dielectric layer by atomic layer deposition according to claim 1, wherein the second oxygen precursor pulse is different from the first oxygen precursor pulse in each of the cycles.

3. The method of forming the high-k dielectric layer by atomic layer deposition according to claim 1, wherein a pulse duration of the second oxygen precursor pulse is longer than a pulse duration of the first oxygen precursor pulse in each of the cycles.

4. The method of forming the high-k dielectric layer by atomic layer deposition according to claim 3, wherein the pulse duration of the second oxygen precursor pulse is 3 to 10 times longer than the pulse duration of the first oxygen precursor pulse in each of the cycles.

5. The method of forming the high-k dielectric layer by atomic layer deposition according to claim 1, wherein an oxygen precursor concentration of the second oxygen precursor pulse is higher than an oxygen precursor concentration of the first oxygen precursor pulse in each of the cycles.

6. The method of forming the high-k dielectric layer by atomic layer deposition according to claim 1, wherein the reactor is purged to remove the oxygen precursor by a purging gas in the first oxygen precursor purge.

7. The method of forming the high-k dielectric layer by atomic layer deposition according to claim 1, wherein the reactor is purged to remove the oxygen precursor by a purging gas in the second oxygen precursor purge.

8. The method of forming the high-k dielectric layer by atomic layer deposition according to claim 1, wherein a purge duration of the second oxygen precursor purge is longer than a purge duration of the first oxygen precursor purge in each of the cycles.

9. The method of forming the high-k dielectric layer by atomic layer deposition according to claim 1, wherein the oxygen precursor of the first oxygen precursor pulse and the oxygen precursor of the second oxygen precursor pulse respectively comprise one selected from the group consisting $H_2O$, $O_2$, $O_3$, and $H_2O_2$.

10. The method of forming the high-k dielectric layer by atomic layer deposition according to claim 1, wherein the chemical precursor comprises a hafnium (Hf) precursor, a tantalum (Ta) precursor, or an aluminum (Al) precursor.

11. The method of forming the high-k dielectric layer by atomic layer deposition according to claim 10, wherein the Hf precursor comprises one selected from the group consisting $HfCl_4$ and tetrakis-ethyl methylaminohafnium (TEMAHf).

12. The method of forming the high-k dielectric layer by atomic layer deposition according to claim 1, wherein the second oxygen precursor pulse is the last pulse step in the atomic layer deposition.

13. The method of forming the high-k dielectric layer by atomic layer deposition according to claim 1, wherein the second oxygen precursor purge is the last step of the atomic layer deposition.

14. The method of forming the high-k dielectric layer by atomic layer deposition according to claim 1, wherein there is not any chemical precursor pulse before the cycles in the atomic layer deposition.

15. The method of forming the high-k dielectric layer by atomic layer deposition according to claim 1, wherein the first oxygen precursor pulse is the first step of the atomic layer deposition.

* * * * *